US 8,754,702 B2

(12) United States Patent
    Walley

(10) Patent No.: US 8,754,702 B2
(45) Date of Patent: Jun. 17, 2014

(54) METHOD AND SYSTEM FOR MONITORING SILICON PROCESS PROPERTIES FOR POWER AND PERFORMANCE OPTIMIZATION

(75) Inventor: John Walley, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 966 days.

(21) Appl. No.: 12/363,143

(22) Filed: Jan. 30, 2009

(65) Prior Publication Data
    US 2010/0194442 A1     Aug. 5, 2010

(51) Int. Cl.
    *H03K 3/42*     (2006.01)
(52) U.S. Cl.
    USPC .......................................... 327/512; 327/362
(58) Field of Classification Search
    USPC .................................. 327/512–513, 378, 362
    See application file for complete search history.

(56) References Cited

U.S. PATENT DOCUMENTS

| | | | |
|---|---|---|---|
| 7,449,972 B2* | 11/2008 | Juang et al. | 331/182 |
| 7,583,151 B2* | 9/2009 | Fan et al. | 331/15 |
| 7,590,392 B2* | 9/2009 | Navaratnam et al. | 455/103 |
| 2009/0079492 A1* | 3/2009 | Wu et al. | 327/509 |

* cited by examiner

*Primary Examiner* — Dinh T. Le
(74) *Attorney, Agent, or Firm* — McDermott Will & Emery LLP

(57) ABSTRACT

Signal processing within an integrated circuit (IC) may be monitored by a silicon process monitor, where one or more inputs to the IC may be controlled. The controlled input may comprise a variable frequency signal, a variable voltage level, an analog signal and/or a known input with a corresponding expected output. The controlled input may drive a plurality of components on the IC. The IC output signal variations may be due to temperature and/or silicon manufacturing processes variations and may affect performance and/or power consumption. IC output signal variations may be detected based on the controlled inputs. Controlled inputs may be adjusted based on the detected output variations and may be adjusted to modify the output. The variations may be detected based on relative frequency between output and the controlled input. In addition, logical operations and/or counters may be utilized to detect variations.

31 Claims, 6 Drawing Sheets

METHOD AND SYSTEM FOR MONITORING SILICON PROCESS PROPERTIES FOR POWER AND PERFORMANCE OPTIMIZATION

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to integrated circuit content. More specifically, certain embodiments of the invention relate to a method and system for monitoring silicon process properties for power and performance optimization.

BACKGROUND OF THE INVENTION

The development and design of radio receivers, transmitters, and/or transceiver systems has been driven by the great demand for devices for mobile wireless communication applications, especially handset devices. With the ever decreasing size of mobile handsets and an ever increasing demand for voice, data, and/or video processing capabilities, there is a growing need to develop radio receivers and transmitters that not only meet these challenging performance requirements, but that do so in smaller integrated circuit (IC) footprints, that is, at lower cost, and with greater power efficiency. One approach that aims at addressing these demands is the development of highly integrated receivers, transmitters, and/or transceivers in complementary metal oxide semiconductor (CMOS) technology to minimize the number of off-chip components.

As a result of these highly integrated systems, radio receivers, transmitters, and/or transceivers may comprise a large number of components and/or circuits, which may be utilized for the processing of signals. The design of optimal systems may require that these components and/or circuits operate within certain requirements or constraints for a wide range of operational conditions. For example, power amplifiers (PA) and/or low noise amplifiers (LNA) may be required to operate at an optimal gain level. However, this gain level may vary significantly based on operational conditions, such as temperature and/or voltage supplies, or based on manufacturing conditions, such as the non-uniformity in transistor parameters that result from normal variations in the manufacturing process. These variations generally referred to as process, voltage, and temperature (PVT) variations, may have a significant effect in the overall performance of wireless handsets.

In systems based on the global system for mobile communications (GSM) standard, for example, PVT variations in many of the circuits and/or components utilized in the receiver or the transmitter may produce errors in the generation of "I" (in-phase) and "Q" (quadrature) signal components. These errors may result in significant degradation in the signal-to-noise ratio (SNR) and/or the bit-error-rate (BER) performance of GSM handsets.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for monitoring silicon process properties for power and performance optimization, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for monitoring silicon process properties for power and performance optimization. In various embodiments of the invention, signal processing within an integrated circuit may be monitored wherein one or more inputs to the integrated circuit may be controlled. The integrated circuit may be operable to function as a process monitor for at least a portion of the integrated circuit. The controlled input may comprise a variable frequency signal, an analog signal and/or a variable voltage level, for example. In various embodiments of the invention, the controlled input may be utilized to drive a plurality of components on the integrated circuit. Variations at an output of the integrated circuit may affect performance and/or power consumption and may be detected based on the controlled one or more inputs. Accordingly, the output may comprise a variable frequency signal, for example. In addition, the inputs may be adjusted based on the detected output variations. For example, the one or more controlled inputs may be adjusted to modify the output.

In various embodiments of the invention, the detected variations may be due to operating temperature and/or variations in silicon manufacturing processes. The variations may be detected based on relative frequency between the output of the integrated circuit and the controlled inputs. In addition, the detection of variations may be based on one or more logical operations performed on the output of the integrated circuit and/or the controlled inputs. Moreover, counting cycles of the output and/or the one or more controlled inputs may enable detection of the variations. In an exemplary embodiment of the invention, the controlled input may comprise known data and a corresponding output may be compared with an expected output. In this manner, silicon process properties may be monitored.

Figure 1:
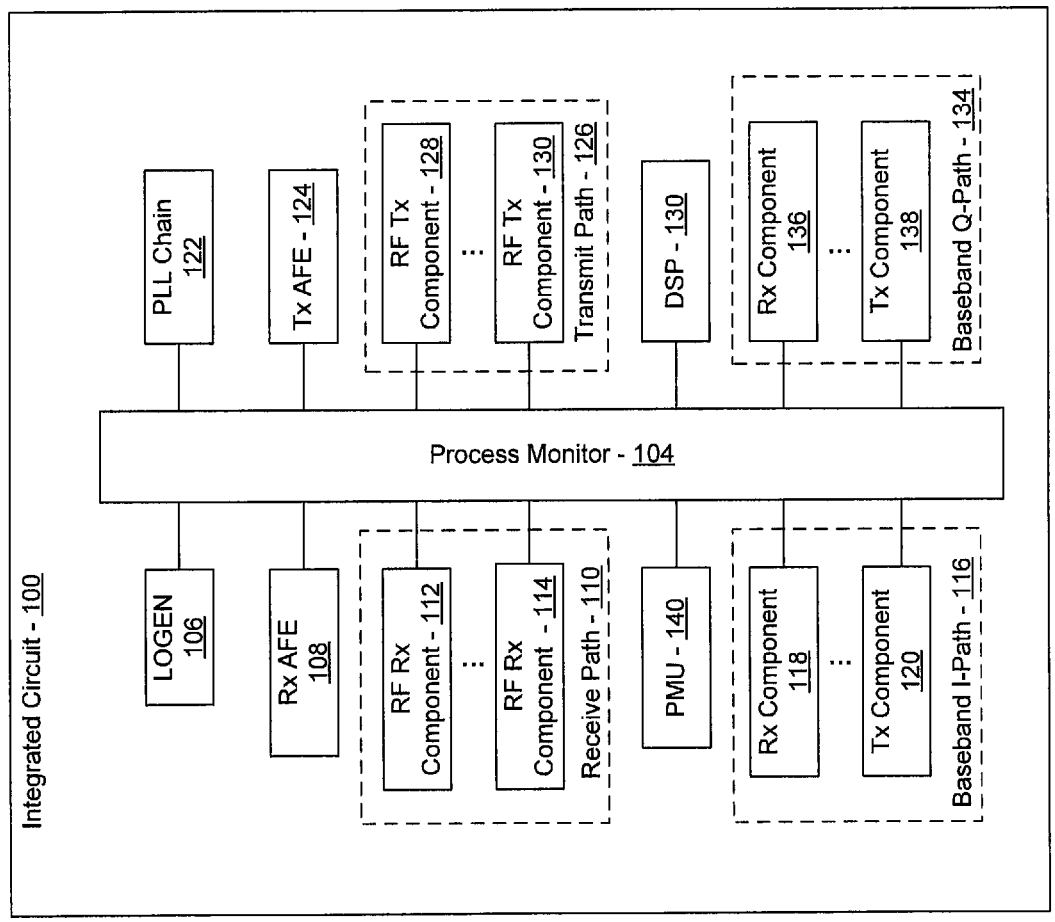
FIG. 1 is a block diagram of an exemplary system comprising a process monitor that may be utilized to compensate system on a chip (SoC) parameters in the presence of IC process manufacturing variations, in accordance with an embodiment of the invention.

FIG. 1 is a block diagram of an exemplary system comprising a process monitor that may be utilized to compensate system on a chip (SoC) parameters in the presence of IC process manufacturing variations, in accordance with an embodiment of the invention. Referring to FIG. 1, there is shown an integrated circuit 100 comprising a plurality of exemplary on-chip components. The plurality of exemplary components may comprise a local oscillator generation (LOGEN) circuit 106, a receiver (Rx) analog front end (AFE) 108, a receive path 110, a power management unit (PMU) 140, and a baseband in-phase (I) path 116. The integrated circuit 100 further comprises a PLL chain 122, a transmit (Tx) analog front end, a transmit path 126, a DSP 132, and a baseband quadrature (Q) path 134. The receive path 110 may comprise a plurality of RF receive components 112, . . . , 114. The transmit path 126 may comprise a plurality of RF transmit components 128, . . . , 130. The baseband in-phase (I) path 116 may comprise a plurality of baseband processing components 118, . . . , 120. For example, the baseband I-path 116 may comprise a receive (Rx) baseband I-path component 118 and a transmit (Tx) baseband I-path component 110. The baseband in-phase (Q) path 134 may comprise a plurality of baseband processing components 136, . . . , 138. For example, the baseband Q-path 134 may comprise a receive (Rx) baseband Q-path component 136 and a transmit (Tx) baseband Q-path component 138.

The process monitor 104 may be enabled to sense process skews for one or more of the components within the integrated circuit 102. In response to the sensing of process skews, the processor monitor 104 may be enabled to adjust one or more process parameters that may be utilized to optimally control operation of one or more of the components within the integrated circuit 100. In an exemplary embodiment of the invention, the process monitor 104 may also be enabled to control one or more of: a bias current, a bandgap current, LO feedthrough, amplifier gain, filter bandwidth, filter Q value, RF amplifier Q compensation value, noise parameters, linearity parameters, VCO gain, PLL bandwidth, of one or more components within the integrated circuit 102. For example, if the RF Tx component 128 is a power amplifier, the processor monitor 104 may be enabled to control a bias current, gain and/or linearity of the RF Tx component 128 in the transmit path 126. In another exemplary embodiment of the invention, in instances where the RF Rx component 112 is a low noise amplifier (LNA), the process monitor 104 may be enabled to control a bias current, gain and/or linearity of the RF Rx component 112 in the receive path 110. In another embodiment of the invention, the processor monitor 104 may be enabled to control various operations of the LOGEN 106, the PLL chain 122, the Rx AFE 108, the Tx AFE 124, the PMU 140 and/or the DSP 132 based on the sensing.

Code running on the DSP 132, for example, may determine which process parameters may be adjusted based on results from the sensing performed by the process monitor 104. Responsive to this determination, the processor monitor 104 may be enabled to control various parameters for one or more of the components within the integrated circuit 100. In one embodiment of the invention, the operation of the process monitor 104 may be independent of temperature variations. Notwithstanding, the invention is not limited in this regard.

Figure 2:
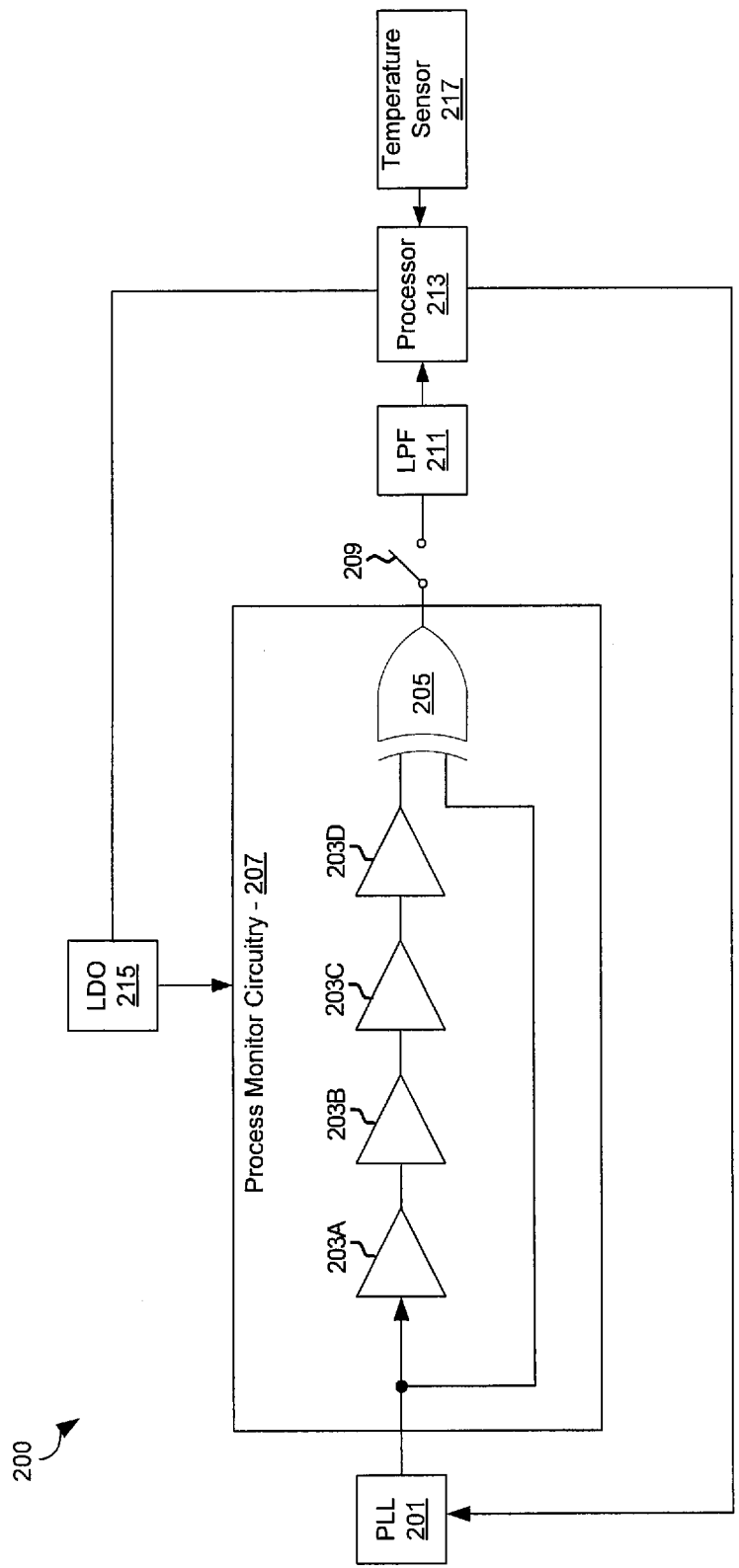
FIG. 2 is a block diagram of an exemplary process monitor enabled to adjust voltage levels based on determined delay that is due to manufacturing process and temperature variations, in accordance with an embodiment of the invention.

FIG. 2 is a block diagram of an exemplary process monitor enabled to adjust voltage levels based on determined delay that is due to manufacturing process and temperature variations, in accordance with an embodiment of the invention. Referring to FIG. 2, there is shown a process monitor 200 comprising a phase locked loop (PLL) 201, a silicon process monitor 207 comprising a plurality of buffers 203A, 203B, 203C and 203D, an exclusive OR (XOR) gate 205, a switch 209, a low pass filter (LPF) 211, a processor 213, a low drop out regulator (LDO) 215, and a temperature sensor 217.

The silicon process monitor 207 may be coupled to the PLL 201 and the LPF 211. The silicon process monitor 207 may be a circuit within an IC that may comprise suitable logic, circuitry and/or code for monitoring and/or managing variations in time it takes for a signal to propagate through the process monitor and/or other circuits driven by the PLL 201. One performance metric for a semiconductor device may be the time it takes for a signal to propagate through the device, for example, through a number of logic gates. The signal propagation time or gate delay may depend in part, on the composition of a given batch of semiconductor material, which may be determined during the process of manufacturing an IC and thus may vary for each IC. For a given silicon chip, the processing speed of the silicon processing monitor 207 may also depend on the PLL 201 output frequency and/or operating temperature variations in the silicon chip, for example. In this regard, the source voltage level that is needed in order to achieve a certain processing speed through the processing monitor 207 varies with temperature for a given piece of silicon.

The processing time or speed for signals propagating through the silicon process monitor 207 may be representative of processing times through other circuits within the same IC. Processing time variations for signals propagating through the silicon process monitor 207 may be sensed and one or more parameters may be adjusted in response to the variations in signal processing time. For example, the source voltage into the PLL 201 may be adjusted by the processor 213. An increase in the PLL 201 input voltage level may increase the PLL 201 output frequency and consequently may increase the frequency of the process monitor 207 output. In some embodiments of the invention, the silicon process monitor 207 may be added to an IC to monitor variations in processing speed. In other embodiments of the invention, the silicon process monitor 207 circuit may be part of a device design and may perform other functionality in addition to process monitoring. In this manner, the process monitor may be implemented within a host IC at little or no additional cost.

The phase locked loop (PLL) 201 may comprise suitable logic, circuitry and/or code to provide a very reliable and known frequency source that may be utilized as a reference when determining the frequency variations in the silicon process monitor 207. The PLL 201 may be coupled to the input of the process monitor 207. The PLL 201 may drive the silicon process monitor 207 at varying frequencies depending on variations in a voltage source controlled by the processor 213. In a closed loop system, depending on variations in frequency of the output of the silicon process monitor 207 relative to the PLL 201 frequency, the voltage source to the PLL 201 may be varied by the processor 213. Variations to the PLL 201's voltage source may modify the PLL 201 output frequency. In various embodiments of the invention, the PLL 201 may drive one or more other circuits within the IC. For example, often communication devices may comprise one or more PLLs that may be utilized as a process monitor. In various embodiments of the invention, the PLL 201 frequency reference may provide RF frequencies.

The buffers 203A, 203B, 203C and 203D may propagate an input signal from the PLL 201 output to the XOR gate 205. In some embodiments of the invention the buffers may be inverters. The exclusive OR (XOR) gate 205 may receive inputs from the PLL 201 and from the output of the buffers 203. The switch 209 may be open when the XOR output is a logical zero and may be closed when the XOR gate 205 output is a logical one. In this regard, the duration of a logical one output from the XOR gate 205 may depend on the speed with which an input signal propagates through the buffers 203. The frequency of the output from the XOR gate 205 may depend on the frequency of the PLL 201. The output from the switch 209 may be coupled to the LPF 211.

The LPF 211 may react slowly to the input from the switch as a signal transitions from a zero to a one and/or a one to a zero. The slow reaction of the LPF 211 may smooth the signal. For example, when the input to the LPF 211 changes abruptly from zero to one, the output of the LPF 211 begins to slowly ramp up and when the input of the LPF 211 abruptly changes back to zero, the output of the LPF 211 may begin to slowly ramp down. If the PLL 201 output and the process monitor 207 output are perfectly in phase at the same frequency, the output of the XOR gate 205 may be equal to zero. As a difference in relative phase between the PLL 201 output and process monitor 207 output increases, the duty cycle of the XOR gate 205 output increases and the output of the LPF 211 ramps up for a longer time. If the relative phase between the PLL 201 and process monitor 207 outputs reaches 180 degrees out of phase, the output of the XOR gate 205 may be at a level of one. For example, when the delay through the process monitor is one half the period of a PLL 201 clock cycle, then the inputs to the XOR gate 205 are 180 degrees out of phase. As the processor 213 input signal levels vary, the processor 213 may adjust the source voltage into the PLL 201 which may consequently vary the relative phase of the PLL 201 and process monitor 207. In this regard, the output of the LPF 211 indicates the degree to which the two output signals are correlated in phase and the feedback from the processor 213 may cause the two outputs to tend toward high correlation.

The low drop out regulator (LDO) 215 may comprise suitable logic circuitry and/or code that may enable adjustable voltage regulation. In this regard, the LDO 215 may supply varying levels of voltage to the process monitor 207 as well as to other components within the integrated circuit 100. The LDO 215 output voltage may be controlled by input from the processor 213. The LDO 215 output voltage may be increased and/or decreased as temperature levels vary in order to maintain a specified speed or frequency of the process monitor 207.

The temperature sensor 217 may comprise suitable logic circuitry and/or code that may be operable to provide temperature readings to the processor 213. The temperature sensor 217 may be integrated into the same silicon chip that the process monitor 207 is a part of. The temperature sensor 217 may provide temperature readings to the processor 213.

The processor 213 may comprise suitable logic, circuitry and/or code that may be operable to maintain a specified processing speed in the process monitor 207 as temperatures vary. The processing speed variations of the process monitor 207 may be communicated to the processor 213 via a signal received from the LPF 211. Accordingly, the processor 213 may vary the source LDO 215 voltage settings as the processing speed varies with the temperature variations. The processor 213 may be operable to associate the various LDO 215 voltage settings and/or parameters with current temperature measurements from the temperature sensor 217. The processor or 213 may save the associated temperature values and parameters for the voltage settings. Once the associated values are stored, the processor 213 may adjust the LDO 215 voltage settings based on temperature readings from the temperature sensor 217. For example, the processor 213 may monitor temperature readings from the temperature sensor 217 and when the temperature changes, the processor 213 may look up the associated LDO 215 voltage settings and re-set the LDO voltage accordingly. In this manner, the processor 213 may maintain a specified processing speed without having to continually run the process monitor 207 circuitry.

In various embodiments of the invention, processor 213 may be operable to reduce power consumption within the process monitor 207 and/or the host IC while maintaining a specified processing speed. In this regard, the processor 213 may be operable to set the processor monitor 207 source voltage from the LDO 215 to a nominal voltage level, for example, 1.2 volts. The processor 213 may lower the LDO 215 voltage and may monitor the processing speed at different voltage levels for a given temperature. In this manner, the processor 213 may determine a reduced LDO 215 voltage level that enables maintaining a specified processing speed in the process monitor 207.

In operation, a process monitor circuit 207, driven by a PLL 201, may be implemented on a host IC to monitor temperature variations and adjust PLL 201 frequency output. Adjustments made by the processor 213 to the PLL 201 and/or the process monitor circuit 207 source voltage may compensate for temperature effects on processing speed of the process monitor 207 and/or of other on chip circuitry. In various embodiments of the invention, the PLL 201 and/or the LDO 215 may be utilized to drive a plurality of components on the silicon chip. Temperature variations sensed by the process monitor 207 may also occur in the other components driven by the PLL 201 and/or the LDO 215. In this manner adjustments made in PLL 201 frequency and/or LDO 215 voltage settings, may compensate for temperature effects in all or portion of the plurality of components driven by the PLL 201. The process monitor 207 may be one of the plurality of components with signal processing functionality on the host IC. Alternatively, it may be a portion of a component, where an output of the component feeds a sensor feed back loop. In this manner, the process monitor may be implemented within a host IC at little or no additional cost. In other embodiments of the invention, the process monitor 207 circuit may have no other function and may be added to the overall design solely for the purpose of process monitoring.

Figure 3A:
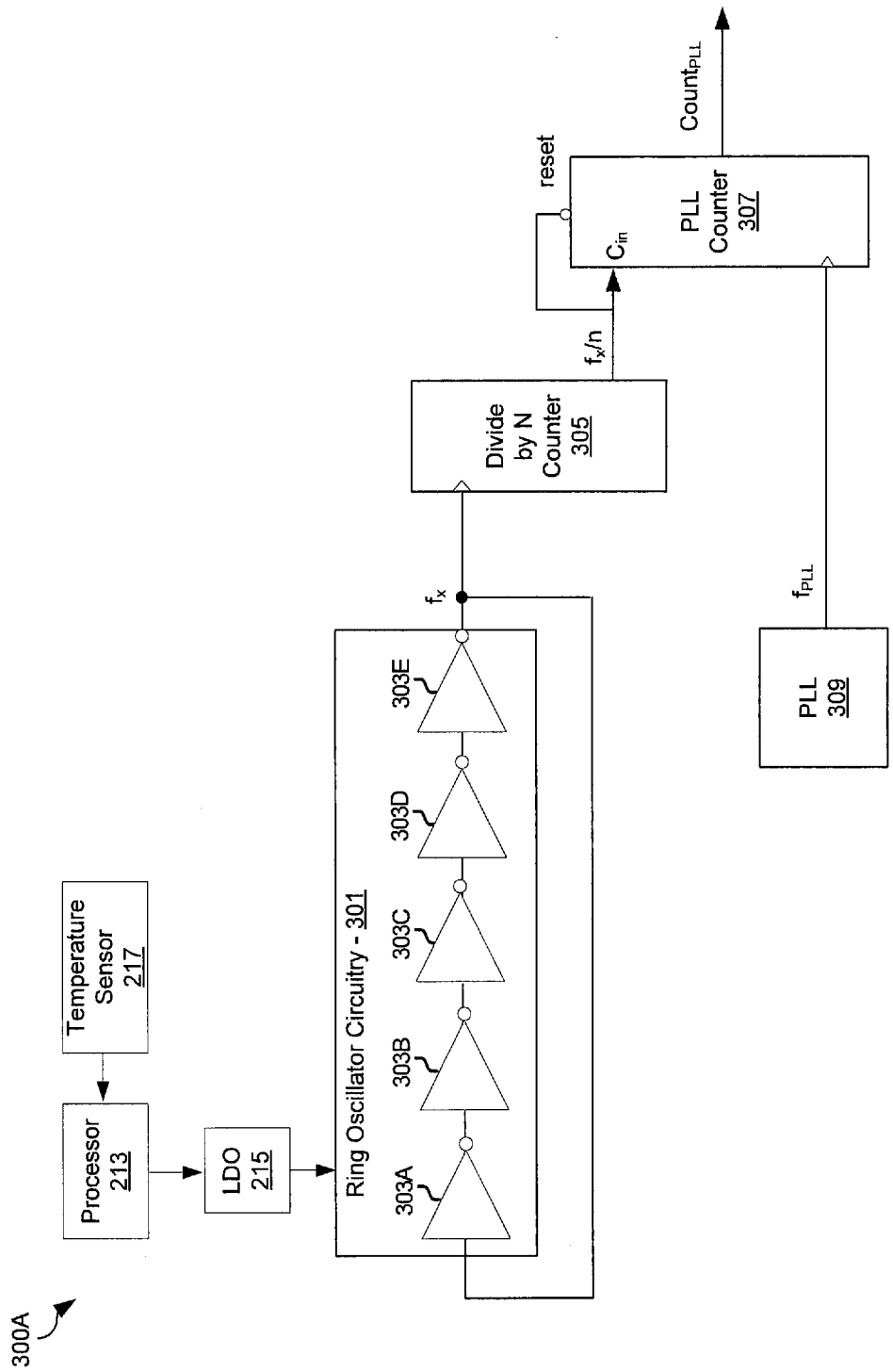
FIG. 3A is a block diagram of an exemplary open loop process monitor enabled to detect and adjust variations in processing delay, in accordance with an embodiment of the invention.

FIG. 3A is a block diagram of an exemplary open loop process monitor enabled to detect and adjust variations in processing delay, in accordance with an embodiment of the invention. Referring to FIG. 3A, there is shown a process monitor 300A comprising a ring oscillator 301, a plurality of inverters 303a, 303b, 303c, 303d and 303e, a divide by N counter 305, a PLL counter 307, a PLL 309, a LDO 215, a processor 213 and a temperature sensor 217.

The LDO 215, processor 213 and temperature sensor 217 are described with respect to FIG. 2. The LDO 215 may be an adjustable voltage regulator that may supply varying levels of voltage to the ring oscillator 301. The LDO 215 output voltage may be controlled by input from the processor 213. In this manner, the LDO 215 output voltage may be modified according to variations in temperature sensed by the temperature sensor 217.

The ring oscillator 301 may comprise suitable logic, circuitry and/or code operable to enable oscillation between two voltage levels at its output. In this regard, the ring oscillator 301 may comprise an odd number of inverters with feedback from the output of the last inverter to the input of the first inverter. This configuration may cause a change in the polarity of the output of the last inverter 303e to invert the input of the first inverter 303a. The last inverter 303e may change polarity again after the 303a input propagates through each inverting gate delay 303a, 303b, 303c and 303d. When the output of inverter 303e changes polarity again, another chain of gate inversions begins. The ring oscillator 301 may function as a process monitor in a way similar to the process monitor 207 described with respect to FIG. 2. In this regard, the gate delay of the inverters 303a through 303e may depend on the composition of semiconductor material and other manufacturing variables for a given silicon chip. In addition, variations in operating temperature may cause variations in the gate delay and the frequency of oscillations at the output of the ring oscillator 301. Once the ring oscillator 331 begins to oscillate, it will continue because of the feedback from the last inverter 303e to the input of the first inverter 303a. A threshold voltage supplied by the LDO 215 to the ring oscillator 301 may be required to maintain oscillations. Increasing the LDO 215 source voltage may increase the frequency of the ring oscillator. A frequency of oscillations output from the ring oscillator 301, $f_x$, may be determined based on a known reference frequency output from the PLL 301 $f_{PLL}$. The ring oscillator 301 may be coupled to the divide by N counter 335.

The divide by N counter 305 may comprise suitable logic, circuitry and/or code to receive an input signal at a first frequency and to output a signal at a second frequency which may be 1/N times the first frequency. For example, in instances when the frequency of the input to the divide by N counter 305 may be $f_x$, the output of the divide by N counter 305 may be $f_x/2$. The input of the divide by N counter 305 may be coupled with the output of ring oscillator 301 and the divide by N output may be coupled with a clock input to the PLL counter 307. In addition, an inversion of the divide by N counter 305 output may be input to the reset input of the PLL counter 307.

The PLL 309 may be similar and/or substantially the same as the PLL 201 described with respect to FIG. 2. The frequency of the PLL 309 output, $f_{PLL}$, may be utilized as a reference to determine the frequency of the ring oscillator 301, $f_x$.

In operation, variations in frequency of the ring oscillator 301 that may be due to temperature may be determined by utilizing the relatively stable output frequency of the PLL 309, $f_{PLL}$, as a reference. In this regard, the PLL counter 307 may count the number of PLL cycles that occur over the time T where the time T may be the duration of time between the front edge of a positive pulse level, output from the divide by N counter 307, to the back edge of the pulse. When the pulse drops to zero, the PLL counter may reset until the next pulse output from the divide by N counter 305 is received. The duration of time T may be one half times the period of one cycle output from the divide by N counter and may be represented as $N/2 f_x$.

The processor 213 may determine appropriate LDO 215 voltage levels for a desired processing speed at varying temperatures. In various embodiments of the invention, once the processor 213 determines appropriate LDO 215 voltage levels corresponding to one or more temperatures, the processor 213 may adjust the LDO 215 voltage levels as temperature readings from the temperature sensor 217 change over time. For example, the processor 213 may create tables that associate temperature sensor readings with corresponding determined voltage levels for a desired processing speed. Once voltage levels are known for various temperatures, the processor 213 may receive temperature readings from the temperature sensor 217 and may look up corresponding voltage levels. The processor 213 may adjust the LDO 215 voltage output level accordingly. In this manner, the processor 213 may maintain a specified processing speed without having to continually run the process monitor 207 circuitry. In addition, the processor 213 may reduce LDO 215 voltage levels such that a specified processing speed may be maintained and power consumption may be reduced.

Figure 3B:
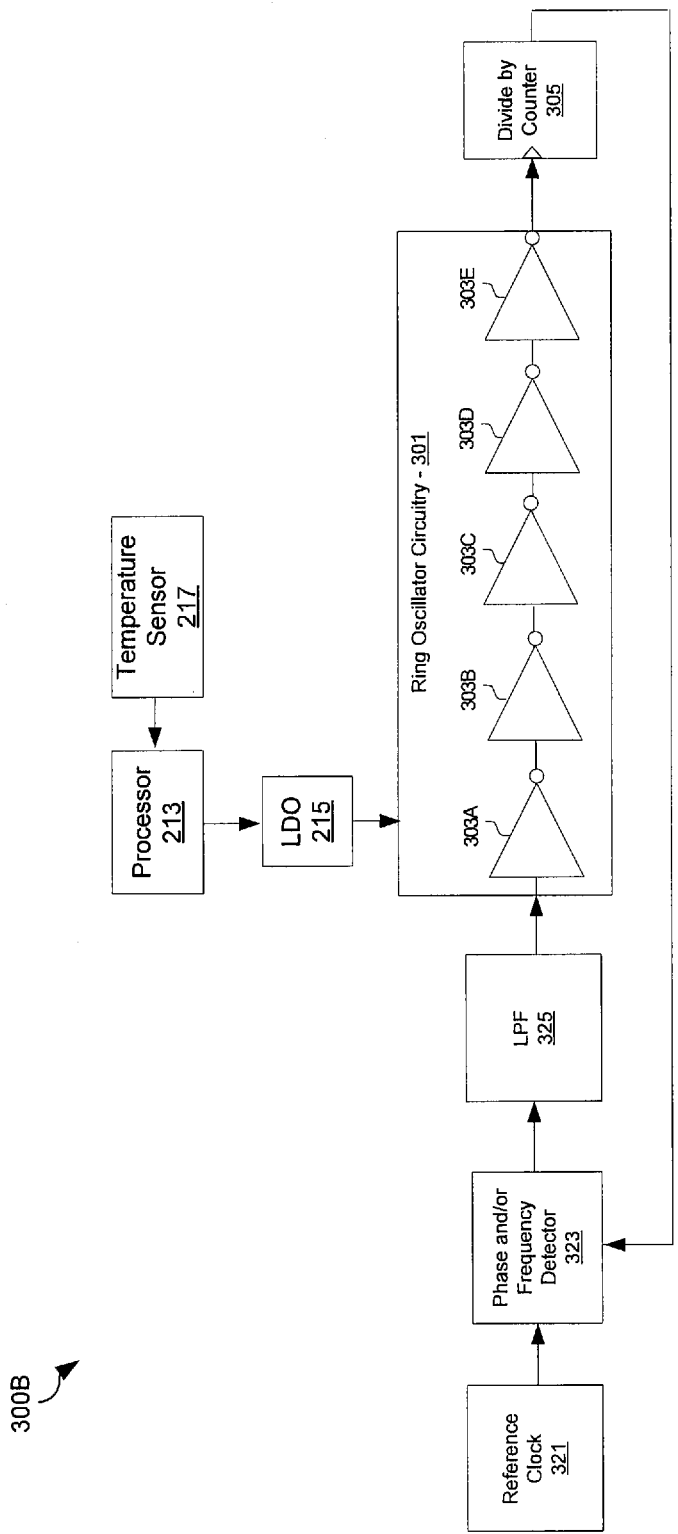
FIG. 3B is a block diagram of an exemplary closed loop process monitor enabled to detect and adjust variations in processing delay, in accordance with an embodiment of the invention.

FIG. 3B is a block diagram of an exemplary closed loop process monitor enabled to detect and adjust variations in processing delay, in accordance with an embodiment of the invention. Referring to FIG. 3B, there is shown a process monitor 300B comprising a reference clock 321, a phase and/or frequency detector 323, a low power filter (LPF) 325, a ring oscillator 301, a plurality of inverters 303a, 303b, 303c, 303d and 303e, a divide by N counter 305, a LDO 215, a processor 213 and a temperature sensor 217.

The LDO 215, processor 213 and temperature sensor 217 are described with respect to FIG. 2. The LDO 215 may be an adjustable voltage regulator that may supply varying levels of voltage to the ring oscillator 301. The LDO 215 output voltage may be controlled by input from the processor 213. In this manner, the LDO 215 output voltage may be modified according to variations in temperature sensed by the temperature sensor 217.

The ring oscillator 301, the plurality of inverters 303a, 303b, 303c, 303d and 303e and the divide by N counter 305 are described with respect to FIG. 3A.

The reference clock 321 may comprise suitable logic, circuitry and/or code that may be operable to provide a reliable and/or known frequency source that may be utilized as a reference when determining the frequency and/or phase variations in the silicon process monitor 301. In various embodiments of the invention, the reference clock may comprise a crystal oscillator and/or a PLL, for example. The reference clock 321 may be coupled to the input of the phase and frequency detector 323. An exemplary reference frequency may be 26 MHz.

The phase and/or frequency detector 323 may comprise suitable logic, circuitry and/or code that are operable to receive as input, output from the reference clock 321 and the divide by N counter 305. The phase and frequency detector 323 may compare the input frequencies and may generate an output voltage that varies according to the difference in input frequencies. The output voltage may be coupled to the LPF 325 input. In various embodiments of the invention, the phase and frequency detector 323 may utilize relative phases of the input frequencies to generate the output voltage level.

The LPF 325 may comprise suitable logic circuitry and/or code that may be operable to provide an error voltage to the ring oscillator 301 that may increase and/or decrease the frequency of the ring oscillator 301. The LPF 325 may receive an output signal from the phase and/or frequency detector 323 and may provide an error signal to the ring oscillator 301. The LPF 325 may determine loop properties for the process monitor. In this regard, the LPF 325 may filter out noise and may determine how quickly the system responds to changes in output from the phase and/or frequency detector 323.

In operation, process monitor 300B may be operable to maintain a certain frequency as variations occur in temperature and/or voltage and/or for silicon manufacturing process variations. In this regard, the phase and/or frequency detector 323 may receive and compare a signal from the reference clock 321 and/or the output of the divide by N counter 305. The value of N may be a static value and/or may be determined dynamically. The frequency output from the ring oscillator may be N times higher than the frequency output from the divide by N counter and/or the reference clock 321. The phase and/or frequency detector 323 may receive and/or compare the reference clock 321 signal to the divide by N counter signal. The phase and/or frequency detector 323 may generate a voltage that may increase and/or decrease relative to a positive and/or negative difference in the frequencies of the received signals. In instances when the frequency and/or phase of the received signals are the same, the phase and/or frequency detector 323 output signal may not change and the oscillator frequency may not be adjusted.

The LPF 325 may receive output of phase and/or frequency detector 323 and may filter out noise and/or modify the rate of the received signal. In this regard, the LPF 325 may provide an error signal to the ring oscillator 301 in order to maintain a certain processing speed. In addition, based on a control signal from the processor 213, the LDO 215 may adjust the source voltage to the ring oscillator 301 and thus adjust the processing speed of the ring oscillator 301. The processor 213 may be operable to reduce power consumption and/or may maintain a certain frequency in the ring oscillator 301. The processor 213 may also vary the LDO 215 output voltage based on temperature information from the temperature sensor 217.

Figure 4:
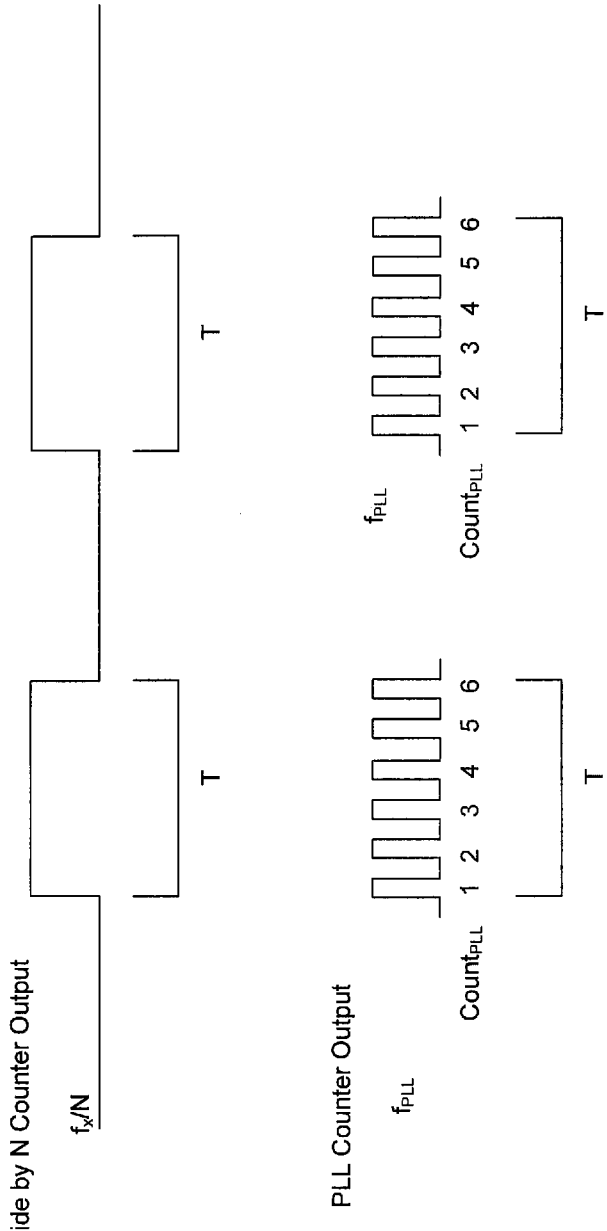
FIG. 4 is a diagram representing an exemplary method for determining processing delay variations in a silicon chip, in accordance with an embodiment of the invention.

FIG. 4 is a diagram of an exemplary method for determining processing delay variations in a silicon chip, in accordance with an embodiment of the invention. Referring to FIG. 4, there is shown exemplary signal properties that may be utilized to determine a delay time through the ring oscillator 301. The delay time through the ring oscillator 301 may be one half of a complete cycle represented as follows.

$$\text{Oscillator Delay} = (\tfrac{1}{2})(1/f_x)$$

where $f_x$ is the unknown frequency of the ring oscillator. In addition, the delay through the ring oscillator is equal to one half cycle or one positive polarity pulse width T through the divide by N counter 307. The unknown positive polarity pulse width from the divide by N counter 307 may be represented as follows.

$$T = (\tfrac{1}{2})(N/f_x)$$

The value of T may also be determined by counting the number of PLL 309 output cycles that may occur during one positive polarity pulse T from the divide by N counter 307 and multiplying by the known period of a PLL cycle $1/f_{PLL}$.

$$T = \text{Count}_{PLL}(1/f_{PLL})$$

where $f_{PLL}$ is the known frequency of the PLL 309. The unknown ring oscillator delay may then be determined once the ring oscillator frequency may be determined as follows.

$$f_x = (N/2)(f_{PLL}/\text{Count}_{PLL})$$

Figure 5:
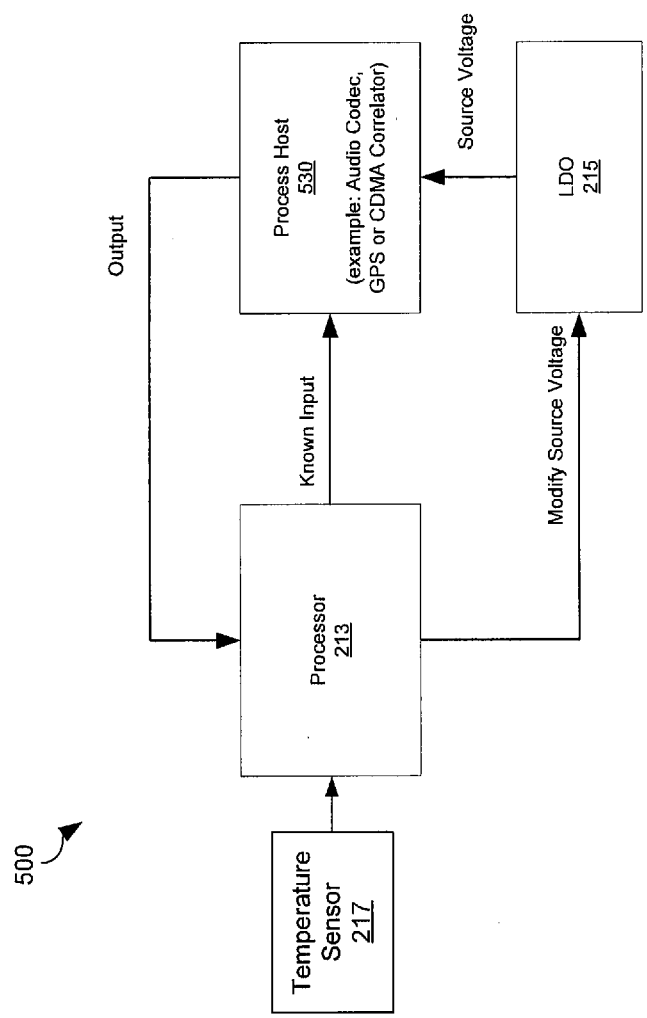
FIG. 5 is an exemplary block diagram of a process monitor enabled to detect processing errors and adjust operating parameters, in accordance with an embodiment of the invention.

FIG. 5 is an exemplary block diagram of a process monitor enabled to detect processing errors and adjust operating parameters, in accordance with an embodiment of the invention. Referring to FIG. 5, there is shown a process monitor 500 comprising a process host 530, a LDO 215, a processor 213 and a temperature sensor 217.

The LDO 215, processor 213 and temperature sensor 217 are described with respect to FIG. 2. The LDO 215 may be operable to adjust voltage levels that may supply voltage to the process host 530. The LDO 215 output voltage may be controlled by input from the processor 213. In this manner, the LDO 215 output voltage may be modified according to variations in temperature sensed by the temperature sensor 217.

The processor 213 may comprise suitable logic circuitry and or code to monitor and/or adjust performance of the process host 530. The processor 213 may send a known input to the process host 530 and may receive a corresponding output from the process host 530. The known input may be, for example, data and/or an analog signal that may be sent to the process host 530 to produce an expected output. In addition, the processor 213 may be enabled to control a variable voltage source to the process host 530, for example, the LDO 215. By varying the voltage source output levels, the processor 213 may adjust performance levels of the process host 530.

The process host 530 may comprise suitable logic, circuitry and/or code to process digital and/or analog signals and produce an expected output based on a known input. The process host 530 may receive the known digital and/or analog signals from the processor 213 and may deliver results back to the processor 213. In addition, the process host 530 may receive varying levels of input voltage from the LDO 215. In this regard, the performance of the process host 530 may be improved and/or degraded based on the level of input voltage received from the LDO 215. For example, by adjusting the input voltage level to the process host 530, success or failure of the host's signal processing may be observed and/or modified by the processor 213. Notwithstanding, the invention is not limited to utilizing varying voltage levels to improve and/or degrade performance of the process host 530 and may utilize any suitable parameters that may adjust results and/or performance of the digital and/or analog signal processing.

The LDO 215 may be an adjustable voltage regulator that may supply varying levels of voltage to the process host 530. The LDO 215 output voltage may be controlled by input from the processor 213.

In operation, the processor 213 may monitor the process host 530 and may make adjustments to process host 530 input parameters and/or voltages in order to operate the process host 530 at a more efficient and/or optimal performance level. The monitoring may be done on a routine basis or may be triggered by an event or, for example, it may be based on configuration parameters. The process host 530 may comprise circuitry that may be highly sensitive to variations in supply voltage relative to other portions of the system that may also receive supply voltage from the LDO 215. In an exemplary embodiment of the invention, the process host 530 may comprise a correlator on a silicon chip. For example, the process host 530 may comprise a correlator that may be utilized in GPS systems and/or CDMA systems. The correlator may enable the systems to detect and/or capture a specified signal and/or code. The process host 530 may receive, for example, a known pseudo noise (PN) code from the processor 213 and may correlate the input signal with the same PN code stored internal to the process host 530. The process host 530 may report results from one or more attempts at correlation to the processor 213. The processor 213 may adjust voltage levels that may be input to the process host 530 to determine and/or adjust the voltage levels that may produce a successful correlation result from the process host 530.

In another embodiment of the invention, the process host 530 may be a microprocessor. The microprocessor may receive a known input from the processor 213 and may run various instructions and/or computations on the known input and may be operable to produce an expected result. The processor 213 may receive the process host 530 output corresponding to the known input. The processor 213 may adjust voltage levels that are input to the process host 530 via the LDO 215 and may monitor results from the process host 530 that correspond to the varying voltage levels. The processor 213 may determine appropriate voltage levels for successful results and/or efficient energy usage and may adjust LDO 215 voltage levels accordingly.

In another embodiment of the invention, the processor host 530 may be an analog circuit, for example, an audio CODEC. The processor 213 may receive output from the CODEC that may indicate a signal to noise ratio (SNR). For example, the SNR of an analog to digital converter (ADC) process and/or of a digital to analog process (DAC) may be measured by the processor 213. The processor 213 may vary voltage levels input to the DAC and/or ADC and may monitor the SNR from their respective outputs. In this regard, an SNR metric may be utilized to determine an appropriate voltage level setting for the LDO 215. The processor 213 may adjust the LDO 215 output accordingly.

In an embodiment of the invention, signal processing within an integrated circuit, for example, within IC 100 and/or one or more of the process monitors 104, 207, 301 and/or 520, may be monitored wherein one or more inputs to the integrated circuit may be controlled. The integrated circuit may be operable to function as a process monitor 104, 207, 301 and/or 520 for at least a portion of the integrated circuit 100. The controlled input may comprise a variable frequency signal, an analog signal and/or a variable voltage level, for example. In various embodiments of the invention, the controlled input may be utilized to drive a plurality of components on the integrated circuit 100. Variations at an output of the integrated circuit, for example, the output of one or more of the process monitors 104, 207, 301 and/or 520, may affect performance and/or power consumption and may be detected based on the controlled one or more inputs. Accordingly, the output may comprise a variable frequency signal for example. In addition, the inputs may be adjusted based on the detected output variations. For example, the one or more controlled inputs may be adjusted to modify the output. In various embodiments of the invention, the detected variations may be due to operating temperature and/or variations in silicon manufacturing processes. The variations may be detected based on relative frequency between the output of said integrated circuit for example, one or more of the process monitors 104 207, 301 and/or 520 and the controlled inputs. In addition, the detection of variations may be based on one or more logical operations via XOR gate 205 and/or the one or more controlled inputs. Moreover, counting cycles of the output and/or the controlled inputs utilizing divide by N counter 305 and/or PLL counter 307 may enable detection of the variations. In an exemplary embodiment of the invention, the controlled input may comprise known data and a corresponding output may be compared with an expected output.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for monitoring silicon process properties for power and performance optimization.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing signals, the method comprising:
controlling one or more inputs to an integrated circuit, wherein said one or more inputs comprises known data;
detecting variations at an output of said integrated circuit that affect at least one of performance or power consumption of said integrated circuit based on said controlling of said one or more inputs; and
adjusting said one or more inputs to said integrated circuit based on said detected variations to optimize at least one of said performance or said power consumption.

2. The method according to claim 1, wherein said detected variations are due to varying operating temperature.

3. The method according to claim 1, wherein said detected variations are due to variations in a silicon manufacturing process.

4. The method according to claim 1, comprising controlling said one or more inputs utilizing a variable frequency signal.

5. The method according to claim 1, wherein said output of said integrated circuit comprises a variable frequency signal.

6. The method according to claim 1, wherein said detecting is based on a relative frequency of said output of said integrated circuit and said one or more inputs.

7. The method according to claim 1, wherein said detecting is based on one or more logical operations performed on said output of said integrated circuit and said one or more inputs.

8. The method according to claim 1, comprising counting cycles of at least one of said output of said integrated circuit or said one or more inputs.

9. The method according to claim 1, wherein said integrated circuit comprises a process monitor.

10. The method according to claim 1, wherein said one or more inputs drives a plurality of components on said integrated circuit.

11. The method according to claim 1, comprising adjusting said one or more inputs to modify said output of said integrated circuit.

12. The method according to claim 1, comprising comparing said output of said integrated circuit with an expected output.

13. The method according to claim 1, wherein detecting said variations comprises sensing a propagation time of said one or more inputs though said integrated circuit.

14. The method according to claim 1, wherein detecting said variations comprises sensing a propagation time of said one or more inputs though said integrated circuit.

15. The method according to claim 1, further comprising detecting a process skew for said integrated circuit based on said variations.

16. The method according to claim 1, comprising adjusting parameters for said integrated circuit based on said detected variations.

17. A system for processing signals, the system comprising:
one or more circuits in an integrated circuit, said one or more circuits being operable to control one or more inputs to said integrated circuit, wherein said one or more inputs comprises known data;
said one or more circuits are operable to detect variations at an output of said integrated circuit that affect at least one of performance or power consumption of said integrated circuit based on said control of said one or more inputs; and
said one or more circuits are operable to adjust said one or more inputs to said integrated circuit based on said detected variations to optimize at least one of said performance or said power consumption.

18. The system according to claim 17, wherein said detected variations are due to varying operating temperature.

19. The system according to claim 17, wherein said detected variations are due to variations in a silicon manufacturing process.

20. The system according to claim 17, wherein said one or more circuits are operable to control said one or more inputs utilizing a variable frequency signal.

21. The system according to claim 17, wherein said output of said integrated circuit comprises a variable frequency signal.

22. The system according to claim 17, wherein said one or more circuits are operable to detect said variations based on a relative frequency of said output of said integrated circuit and said one or more inputs.

23. The system according to claim 17, wherein said one or more circuits are operable to detect said variations based on one or more logical operations performed on said output of said integrated circuit and said one or more inputs.

24. The system according to claim 17, wherein said one or more circuits are operable to count cycles of at least one of said output of said integrated circuit or said one or more inputs.

25. The system according to claim 17, wherein said integrated circuit comprises a process monitor.

26. The system according to claim 17, wherein said one or more inputs drives a plurality of components on said integrated circuit.

27. The system according to claim 17, wherein said one or more circuits are operable to adjust said one or more inputs to modify said output of said integrated circuit.

28. The system according to claim 17, wherein said one or more circuits are operable to compare said output of said integrated circuit with an expected output.

29. The system according to claim 17, wherein said one or more circuits are operable to sense a propagation time of said one or more inputs though said integrated circuit.

30. The system according to claim 17, wherein said one or more circuits are operable to detect a process skew for said integrated circuit based on said variations.

31. The system according to claim 17, wherein said one or more circuits are operable to adjust parameters for said integrated circuit based on said detected variations.

* * * * *